(12) United States Patent
Hosomi et al.

(10) Patent No.: US 7,525,166 B2
(45) Date of Patent: Apr. 28, 2009

(54) MEMORY ELEMENT AND MEMORY

(75) Inventors: Masanori Hosomi, Kanagawa (JP);
Hiroyuki Ohmori, Kanagawa (JP);
Tetsuya Yamamoto, Kanagawa (JP);
Yutaka Higo, Miyagi (JP); Kazutaka Yamane, Miyagi (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 69 days.

(21) Appl. No.: 11/736,360

(22) Filed: Apr. 17, 2007

(65) Prior Publication Data

US 2007/0242502 A1  Oct. 18, 2007

(30) Foreign Application Priority Data

Apr. 17, 2006  (JP) ............................. 2006-113538

(51) Int. Cl.
*H01L 29/82* (2006.01)
(52) U.S. Cl. ............... 257/421; 257/295; 257/E27.006; 365/158
(58) Field of Classification Search ................. 257/421, 257/E27.006
See application file for complete search history.

(56) References Cited

U.S. PATENT DOCUMENTS

| 6,256,223 | B1 | 7/2001 | Sun |
| 6,603,677 | B2 | 8/2003 | Redon et al. |
| 7,301,733 | B1 | 11/2007 | Fukuzawa et al. |
| 2005/0094322 | A1* | 5/2005 | Fukuzawa et al. ........ 360/324.1 |
| 2007/0097736 | A1* | 5/2007 | Inokuchi et al. ............. 365/158 |
| 2007/0188945 | A1 | 8/2007 | Yoshihiko et al. |

FOREIGN PATENT DOCUMENTS

| JP | 2000-006774 | 1/2000 |
| JP | 2000-156531 | 6/2000 |
| JP | 2002-305337 | 10/2002 |
| JP | 2003-017782 | 1/2003 |
| JP | 2004-006589 | 1/2004 |
| JP | 2004-006774 | 1/2004 |
| JP | 2007-150265 | 6/2007 |
| JP | 2007-220854 | 8/2007 |

OTHER PUBLICATIONS

Nikkei Electronics, Feb. 12, 2001, No. 789, pp. 164-171.
L. Berger, "Emission of spin waves by a magnetic multilayer traversed by a current," Physical Review B, Oct. 1996, vol. 54, No. 13, pp. 9353-9358.
J.C. Slonczewski, "Current-driven excitation of magnetic multilayers," Journal of Magnetism and Magnetic Materials, 159 (1996), L1-L7.

* cited by examiner

Primary Examiner—Tu-Tu V Ho
(74) Attorney, Agent, or Firm—K&L Gates LLP

(57) ABSTRACT

A memory element is provided. The memory element includes a memory layer that retains information based on a magnetization state of a magnetic material, in which a magnetization pinned layer is provided for the memory layer through an intermediate layer, the intermediate layer is formed of an insulator, spin-polarized electrons are injected in a stacking direction to change a magnetization direction of the memory layer, so that information is recorded in the memory layer, and a fine oxide is dispersed in an entire or part of a ferromagnetic layer forming the memory layer.

7 Claims, 5 Drawing Sheets

MEMORY ELEMENT AND MEMORY

CROSS REFERENCES TO RELATED APPLICATIONS

The present application claims priority to Japanese Patent Application JP 2006-113538 filed in the Japanese Patent Office on Apr. 17, 2006, the entire contents of which is being incorporated herein by reference.

BACKGROUND

The present application relates to a memory element including a memory layer that stores a magnetization state of a ferromagnetic layer as information and a magnetization pinned layer in which a magnetization direction is pinned. Specifically, the present application relates to a memory element in which current is caused to flow in a direction perpendicular to a film surface to inject spin-polarized electrons, so that a magnetization direction of the memory layer is changed; and also relates to a memory including the memory element suitably applied to a non-volatile memory.

High-speed and high-density DRAMs have been widely used as random access memories in information equipment such as computers.

However, since DRAMs are volatile memories from which information is erased when a power supply is switched off, non-volatile memories in which information is retained when a power supply is switched off have been desired.

Nikkei Electronics (Feb. 12, 2001 (pp. 164-171)), for example, discloses magnetic random access memories (MRAMs) that record information by magnetization of a magnetic material have been attracted attention and developed as potential non-volatile memories.

In an MRAM, the information is recorded such that current is caused to flow into two types of address wirings almost perpendicular to each other (word lines and bit lines), respectively, to invert magnetization of a magnetic layer of a magnetic memory element in an intersection of the address wirings based on a current magnetic field generated from each address wiring.

A schematic view (oblique view) of a typical MRAM is shown in FIG. 1.

In an area isolated by an element isolation layer 102 of a semiconductor substrate 110 such as a silicon substrate, a drain region 108, source regions 107, and gate electrodes 101 which form selective transistors for selecting each memory cell are respectively formed.

Word lines 105 extending in a longitudinal direction in the figure are provided above the gate electrodes 101.

The drain region 108 is also formed both on the left and right selective transistors in the figure, and a wiring 109 is connected to the drain region 108.

Magnetic memory elements 103 each having a memory layer in which a magnetization direction is inverted are placed between the word lines 105 and bit lines 106 that are placed above the word lines 105 and extended in a transverse direction in the figure. The magnetic memory elements 103 are formed by magnetic tunnel junction elements (MTJ elements), for example.

Further, the magnetic memory elements 103 are electrically connected to the source regions 107 through a bypass line 111 in a horizontal direction and a contact layer 104 in a vertical direction.

Current is caused to flow into the word lines 105 and the bit lines 106, respectively, to apply a current magnetic field to the magnetic memory elements 103, so that a magnetization direction of the memory layers of the magnetic memory elements 103 may be inverted to record information.

In order to allow a magnetic memory such as MRAM to stably retain recorded information, a magnetic layer (memory layer) to record information preferably may have a certain coercive force.

On the other hand, in order to rewrite the recorded information, a certain amount of current may preferably be caused to flow into address wirings.

However, as an element forming an MRAM is decreasing in size, address wirings are thin, and thus a sufficient amount of current may not be caused to flow into the wirings.

Japanese Patent Application Publication No. 2003-17782, U.S. Pat. No. 6,256,223, Phys. Rev. B 54.9353 (1996), and J. Magn. Mat. 159.L1 (1996), for example, respectively disclose memories that configured to use magnetization inversion by spin injection have been attracted attention as those configured to allow magnetization to be inverted using a smaller amount of current.

In magnetization inversion by spin injection, electrons spin-polarized by passing through a magnetic material are injected into another magnetic material to invert magnetization in the other magnetic material.

For example, current is caused to flow into giant magnetoresistance elements (GMR elements) or magnetic tunnel junction elements (MTJ elements) in a direction perpendicular to a film surface of the elements, so that a magnetization direction of at least some of magnetic layers of the elements may be inverted.

Magnetization inversion by spin injection is advantageous in that magnetization may be inverted without increasing an amount of current even though an element is reduced in size.

FIGS. 8 and 9 show schematic views of a memory configured to utilize the above-described magnetization inversion by spin injection; FIG. 8 is an oblique view, and FIG. 9 is a sectional view.

In an area isolated by an element isolation layer 52 of a semiconductor substrate 60 such as a silicon substrate, a drain region 58, source regions 57, and gate electrodes 51 which form selective transistors for selecting each memory cell are respectively formed. Of these, the gate electrodes 51 also function as word lines extending in a longitudinal direction in FIG. 8.

The drain region 58 is also formed both on the left and right selective transistors in FIG. 8, and a wiring 59 is connected to the drain region 58.

Memory elements 53 each having a memory layer in which a magnetization direction is inverted by spin injection are placed between the source regions 57 and bit lines 56 that are placed above the source regions 57 and extended in a transverse direction in FIG. 8.

The memory elements 53 are formed by magnetic tunnel junction elements (MTJ elements), for example. Reference numerals 61 and 62 in the figure denote magnetic layers. One of the two magnetic layers 61 and 62 is a magnetization pinned layer in which a magnetization direction is pinned, and the other is a magnetization free layer in which a magnetization direction is changed, specifically, a memory layer.

The memory elements 53 are connected to the bit lines 56 and the source regions 57 respectively through upper or lower contact layers 54. Thus, a magnetization direction of the memory layer may be inverted by spin injection that causes current to flow into the memory elements 53.

Such a memory configured to utilize magnetization inversion by spin injection has a feature in that the memory can have a device structure more simplified as compared with a common MRAM shown in FIG. 1.

The memory configured to utilize magnetization inversion by spin injection is more advantageous than a common MRAM in which magnetization is inverted by an external magnetic field, because an amount of writing current is not increased although the elements are further reduced in size.

In an MRAM, write wirings (word lines and bit lines) are provided separate from memory elements, and information is written (recorded) based on a current magnetic field generated by causing current to flow into the write wirings. Thus, an amount of current which may be necessary for writing may be sufficiently caused to flow into the write wirings.

On the other hand, in a memory configured to utilize magnetization inversion by spin injection, spin injection is preferably performed by causing current to flow into a memory element to invert a magnetization direction of a memory layer.

Since information is written (recorded) by directly causing current to flow into the memory element in this manner, the memory element is connected to a selective transistor to form a memory cell in order to select a memory cell to be written. In this case, an amount of current caused to flow into the memory element is limited to the amount of current which may be caused to flow into the selective transistor (saturated current of the selective transistor).

Therefore, writing is preferably performed using current in an amount equal to or smaller than the saturated current of the selective transistor, and an amount of current caused to flow into the memory element is preferably reduced by improving spin injection efficiency.

In order to amplify a read signal, a high magnetoresistance change rate may preferably be secured. To secure a high magnetoresistance change rate, it is effective to provide a memory element having a configuration in which an intermediate layer in contact with both sides of the memory layer forms a tunnel insulating layer (tunnel barrier layer).

When the tunnel insulating layer is used as an intermediate layer in this manner, an amount of current caused to flow into the memory element is limited in order to prevent dielectric breakdown of the tunnel insulating layer. From this viewpoint, an amount of current during spin injection may preferably be suppressed.

A memory preferably stores and retains information written by current. Thus, it is preferable to secure that a memory layer has stability against thermal fluctuation (thermal stability).

A memory element utilizing magnetization inversion by spin injection has a memory layer having its volume smaller than that of a memory layer of an MRAM of the related art. Thus, the memory element may tend to have decreased thermal stability.

When thermal stability of the memory layer is not secured, an inverted magnetization direction is inverted by heat, thereby causing a writing error.

Therefore, thermal stability is a highly important property in the memory element utilizing magnetization inversion by spin injection.

Generally, in an element that does not consume a large amount of energy in writing, an energy barrier is low and thus information is easily erased.

On the other hand, an element that consumes a large amount of energy in writing can form a high energy barrier and thus may stably retain information.

When comparing memory elements that utilize magnetization inversion by spin injection and are configured to have equal spin injection efficiency, such a memory element that has a memory layer having a larger amount of saturated magnetization and a larger volume has higher thermal stability and, at the same time, may need a larger amount of current in writing.

A thermal stability index can generally be represented by a thermal stability parameter ($\Delta$).

The thermal stability parameter ($\Delta$) is obtained from the formula $\Delta=KV/kT$ (K: anisotropic energy, V: volume of the memory layer, k: Boltzmann constant, T: temperature).

Accordingly, in order that a memory may be formed by a memory element configured to have a memory layer in which a magnetization direction is inverted by spin injection, it is preferable that spin injection efficiency be improved so that an amount of current is reduced, which may be necessary for magnetization inversion to equal to or smaller than saturated current of a transistor, and thermal stability be secured to stably retain written information.

SUMMARY

According to an embodiment, there is provided a memory element that may improve thermal stability without increasing an amount of writing current, and a memory including the memory element.

A memory element according to an embodiment includes a memory layer that retains information based on a magnetization state of a magnetic material. In this embodiment, a magnetization pinned layer is provided for the memory layer through an intermediate layer; the intermediate layer includes an insulator; spin-polarized electrons are injected in a stacking direction to change a magnetization direction of the memory layer, so that information is recorded in the memory layer; and a fine oxide is dispersed in an entire or part of a ferromagnetic layer forming the memory layer.

A memory according to an embodiment includes a memory element having a memory layer that retains information based on a magnetization state of a magnetic material; and two types of wirings intersecting with each other, in which the memory element is configured to be a memory element of an embodiment; the memory element is placed near an intersection of the two types of wirings and between the two types of wirings; and current in a stacking direction flows into the memory element through the two types of wirings, so that spin-polarized electrons are injected.

A memory element according to the above-referenced embodiment is configured to include a memory layer that retains information based on a magnetization state of a magnetic material. In this embodiment, a magnetization pinned layer is provided for the memory layer through an intermediate layer; the intermediate layer is formed of an insulator; and spin-polarized electrons are injected in a stacking direction to change a magnetization direction of the memory layer, so that information is recorded in the memory layer. Thus, spin-polarized electrons may be injected by causing current to flow in a stacking direction to record information.

A fine oxide is dispersed in an entire or part of a ferromagnetic layer forming the memory layer, so that the memory layer can have an increased coercive force as compared with a case where the ferromagnetic layer is formed only by a ferromagnetic material. The memory layer may have an increased coercive force in this manner, and thus the memory layer can have improved thermal stability.

Further, a fine oxide is dispersed in an entire or part of a ferromagnetic layer forming the memory layer, so that the memory layer can have an increased coercive force without increasing an amount of saturated magnetization of the memory layer.

Thermal stability of the memory layer can thus be sufficiently secured without increasing an amount of writing current which may be necessary to invert a magnetization direction of the memory layer.

A memory according to the above-referenced embodiment is configured to include a memory element having a memory layer that retains information based on a magnetization state of a magnetic material; and two types of wirings intersecting with each other, in which the memory element is configured to be a memory element of an embodiment; the memory element is placed near an intersection of the two types of wirings and between the two types of wirings; and current in a stacking direction flows into the memory element through the two types of wirings, so that spin-polarized electrons are injected. Thus, information may be recorded by spin injection by causing current to flow through the two types of wirings in a stacking direction of the memory element.

Further, thermal stability of the memory layer may be sufficiently secured without increasing an amount of writing current which may be necessary to invert a magnetization direction of the memory layer of the memory element. Thus, information recorded in a memory cell may be stably retained without increasing power consumption in the memory.

A memory element according to an embodiment includes a memory layer that retains information based on a magnetization state of a magnetic material. In this embodiment, a magnetization pinned layer is provided for the memory layer through an intermediate layer; the intermediate layer is formed of an insulator; spin-polarized electrons are injected in a stacking direction to change a magnetization direction of the memory layer, so that information is recorded in the memory layer; and a fine oxide is distributed in layers in an entire or part of a ferromagnetic layer forming the memory layer.

A memory according to an embodiment includes a memory element having a memory layer that retains information based on a magnetization state of a magnetic material; and two types of wirings intersecting with each other, in which the memory element is configured to be a memory element of an embodiment; the memory element is placed near an intersection of the two types of wirings and between the two types of wirings; and current in a stacking direction flows into the memory element through the two types of wirings, so that spin-polarized electrons are injected.

A memory element according to the above embodiment is configured to include a memory layer that retains information based on a magnetization state of a magnetic material. In this embodiment, a magnetization pinned layer is provided for the memory layer through an intermediate layer; the intermediate layer is formed of an insulator; and spin-polarized electrons are injected in a stacking direction to change a magnetization direction of the memory layer, so that information is recorded in the memory layer. Thus, spin-polarized electrons may be injected by causing current to flow in a stacking direction to record information.

A fine oxide is distributed in layers in an entire or part of a ferromagnetic layer forming the memory layer, so that the memory layer can have an increased coercive force as compared with a case where the ferromagnetic layer is formed only by a ferromagnetic material. The memory layer can have an increased coercive force in this manner, and thus the memory layer can have improved thermal stability.

Further, a fine oxide is distributed in layers in an entire or part of a ferromagnetic layer forming the memory layer, so that the memory layer can have an increased coercive force without increasing an amount of saturated magnetization of the memory layer.

Thermal stability of the memory layer can thus be sufficiently secured without increasing an amount of writing current which may be necessary to invert a magnetization direction of the memory layer.

A memory according to the above embodiment is configured to include a memory element having a memory layer that retains information based on a magnetization state of a magnetic material; and two types of wirings intersecting with each other, in which the memory element is configured to be a memory element of an embodiment; the memory element is placed near an intersection of the two types of wirings and between the two types of wirings; and current in a stacking direction flows into the memory element through the two types of wirings, so that spin-polarized electrons are injected. Thus, information may be recorded by spin injection by causing current to flow through the two types of wirings in a stacking direction of the memory element.

Further, thermal stability of the memory layer may be sufficiently secured without increasing an amount of writing current which may be necessary to invert a magnetization direction of the memory layer of the memory element. Thus, information recorded in a memory cell may be stably retained without increasing power consumption in the memory.

According to the above embodiment, thermal stability as an information retaining property may be secured without increasing an amount of writing current (threshold current). Thus, a memory element having well-balanced properties may be formed.

This may eliminate an operation error and provide a sufficient operational area for a memory element.

Further, since an amount of writing current is not increased although thermal stability that may be necessary for a memory is secured, a large amount of current does not have to be applied to. Thus, an insulator as an intermediate layer is not broken down.

Accordingly, a highly reliable memory that is stably operated may be achieved.

In addition, thermal stability that may be necessary for a memory to be sufficiently secured although an amount of writing current is decreased. Thus, an amount of writing current may be decreased so that power consumption may also be reduced when writing is performed in a memory element.

Accordingly, total power consumption in a memory can also be reduced.

Additional features and advantages are described herein, and will be apparent from, the following Detailed Description and the figures.

DETAILED DESCRIPTION

Figure 1:
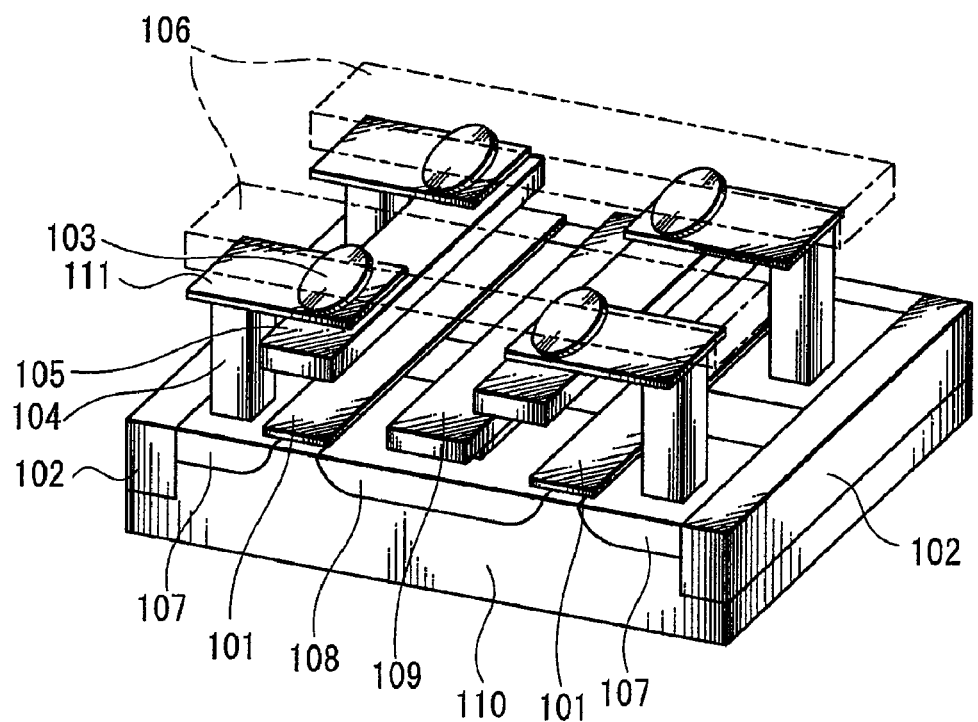
FIG. 1 is an oblique view schematically showing a configuration of an MRAM of related art.

A detailed description of embodiments follows including reference to the figures. In an embodiment, information is recorded by inverting a magnetization direction of a memory layer of a memory element by the above-described spin injection. The memory layer is formed by a magnetic material such as a ferromagnetic layer and retains information based on a magnetization state (magnetization direction) of the magnetic material.

In a basic operation of inverting a magnetization direction of a magnetic layer by spin injection, current having a certain threshold value (Ic) or higher is caused to flow into a memory element formed of a giant magnetoresistance element (GMR element) or magnetic tunnel junction element (MTJ element) in a direction perpendicular to a film surface of the memory element. Here, a polarity (direction) of current depends on a magnetization direction to be inverted.

When current having an absolute value smaller than the threshold value is caused to flow, magnetization inversion does not occur.

A threshold value Ic of current which may be necessary for inverting a magnetization direction of a magnetic layer by spin injection is phenomenologically represented by the following formula (I) (see F. J. Albert et al., ppl. Phys. Lett., 77, p. 3809, 2000).

$$Ic = A \frac{\alpha}{\eta} Ms^2 V$$

In the formula (1), A is a constant, $\alpha$ is a spin damping constant, $\eta$ is spin injection efficiency, Ms is an amount of saturated magnetization, and V is a volume of a magnetic layer (memory layer).

According to an embodiment, a threshold value of current may be arbitrarily selected by controlling a volume of a magnetic layer V, an amount of saturated magnetization of a magnetic layer Ms, spin injection efficiency, and a damping constant, as represented by the formula (1).

A memory element is formed having a magnetic layer (memory layer) that may retain information based on a magnetization state and a magnetization pinned layer in which a magnetization direction is pinned.

Preferably, a memory may retain written information. Information retaining capability is evaluated by referring a value of the above-described thermal stability index $\Delta$. A thermal stability index $\Delta$ of a magnetic layer (memory layer) is represented by the following formula (2).

$$\Delta = B \cdot Hc_0 \cdot Ms \cdot V$$

In the formula (2), B is a constant, $Hc_0$ is a coercive force at 0K Hc, Ms is an amount of saturated magnetization, and V is a volume.

Generally, a value of $\Delta$ is preferably 60 or more in order to retain stored information at 85° C. for 10 years. This $\Delta$ value and a threshold value of current Ic often have a trade-off relation, and it may often be necessary to balance these values to maintain memory characteristics.

In an approximately elliptical tunnel magnetoresistance element (TMR element) having a memory layer with a thickness of 2 mm and having a flat pattern of 100 nm×100 nm, for example, current to change a magnetization state of the memory layer actually has threshold values in which a positive threshold value +Ic=+0.5 mA and a negative threshold value −Ic=−0.3 mA. A current density at this time is about $3.5 \times 10^6$ A/cm$^2$. These threshold values almost correspond to those calculated from the formula (1).

On the other hand, in a typical MRAM in which magnetization is inverted based on a current magnetic field, an amount of writing current is preferably several mA or more.

In contrast, a memory in which magnetization inversion may be performed by spin injection effectively may reduce its power consumption in an integrated circuit, because a threshold value of writing current may be sufficiently small as described above.

Further, such a memory is more advantageous than a typical MRAM in integration degrees, because the memory may not use a wiring for generating a current magnetic field (wiring 105 in FIG. 1) which may be necessary for a common MRAM.

Since information is written (recorded) by directly causing current to flow into a memory element in a memory in which magnetization inversion is performed by spin injection, the memory element is connected to a selective transistor to form a memory cell in order to select a memory cell in which writing is performed.

In this case, an amount of current caused to flow into the memory element is limited to an amount of current which may be caused to flow into the selective transistor (saturated current of the selective transistor). Thus, an allowable range of amounts of writing current may also be limited.

On the other hand, when a magnetization amount of a memory layer is reduced, an allowable range of amounts of writing current may be increased by reducing a threshold value of writing current. However, as described above, this impairs thermal stability of the memory layer (index $\Delta$). In order to form a memory, a thermal stability index $\Delta$ is preferably a certain value or higher.

According to an embodiment, thermal stability may be improved without increasing an amount of writing current and a stable memory may be formed by limiting a material of at least one ferromagnetic layer forming a memory layer and by specifying a fine structure of the layer.

Specifically, a coercive force of a memory layer may be improved but an amount of saturated magnetization of the memory layer may not be increased by specifying a fine structure of a ferromagnetic layer forming the memory layer.

A configuration in which a fine oxide is dispersed in an entire or part of a ferromagnetic layer forming a memory layer is effective for achieving a large coercive force without increasing an amount of saturated magnetization of the memory layer.

As an oxide material to be dispersed in a memory layer, it is preferable to select a material that does not chemically react with a ferromagnetic layer having Co or Fe as a main component and forms a stable oxide.

Further, such a material may not impair magnetization resistance of a tunnel magnetoresistance element.

Preferable oxide materials that meet the above-described conditions for an oxide material and may increase a coercive force without considerably increasing an inversion current density include silicon oxide, aluminum oxide, magnesium oxide, tantalum oxide, gadolinium oxide, titanium oxide, boron oxide, zinc oxide, gallium oxide, yttrium oxide, zirconium oxide, hafnium oxide, and composite mixtures thereof.

These oxides are formed by a method of directly sputtering an oxide together with a ferromagnetic material or a method of causing a fine oxide to precipitate after annealing.

A volume rate of an oxide is preferably 5% or more to 40% or less based on the total volume of a memory layer.

When the volume rate of an oxide is more than 40%, a ferromagnetic layer is divided into small domains by the oxide, and too large a distance is provided between the domains, resulting in difficulty in securing sufficient magnetic properties.

On the contrary, an oxide dispersion effect may be achieved when an oxide is contained at a volume rate of 5% or more.

When the volume rate of an oxide is less than 5%, oxygen simply forms a solid solution in a ferromagnetic layer, and an effect of an embodiment may not be sufficiently achieved.

As a distribution state of an oxide in a memory layer, it is suitable to provide a state in which a fine oxide is uniformly dispersed.

However, when an amount of an oxide is large, an amount of writing threshold current is further reduced if the oxide is distributed in layers in parallel with a film surface of the memory layer.

Figure 4A:
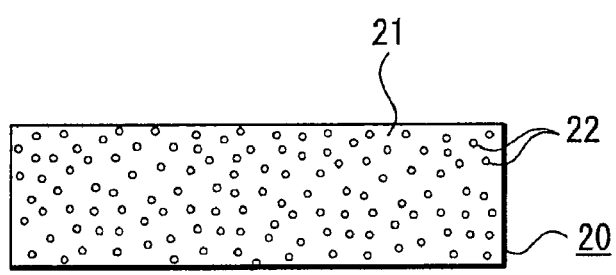
FIGS. 4A to 4D are schematic views illustrating a distribution state of an oxide in a memory layer according to an embodiment.
Figure 4B:
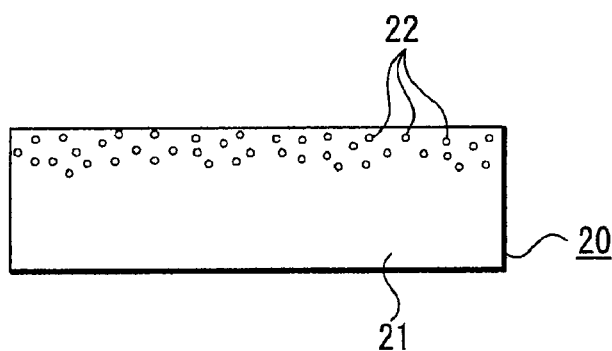

Here, FIGS. 4A and 4B respectively show a schematic view of a state in which a fine oxide is dispersed in a memory layer. FIG. 4A shows a state in which a fine oxide is dispersed in an entire memory layer, and FIG. 4B shows a state in which a fine oxide is present only in part of a memory layer.

In FIG. 4A, a fine oxide 22 is dispersed in a ferromagnetic layer 21 forming a memory layer 20, and the oxide 22 is distributed in the entire ferromagnetic layer 21.

In FIG. 4B, a fine oxide 22 is dispersed in a ferromagnetic layer 21 forming a memory layer 20, and the oxide 22 is present only in an upper part of the ferromagnetic layer 21.

Figure 4C:
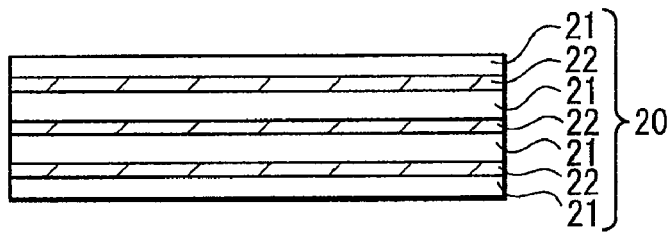
Figure 4D:
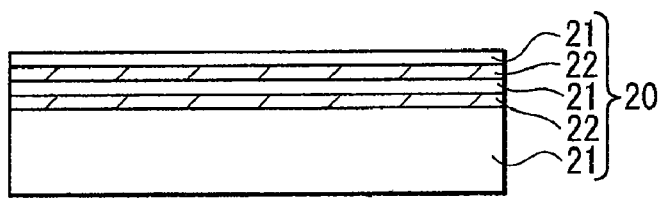

FIGS. 4C and 4D respectively show a schematic view of a state in which an oxide is distributed in layers in parallel with a film surface of a memory layer. FIG. 4C shows a state in which an oxide is uniformly distributed in an entire memory layer, and FIG. 4D shows a state in which an oxide is present only in an upper part of a memory layer.

In FIG. 4C, a fine oxide 22 is distributed in a memory layer 20 in layers in parallel with a film surface of the memory layer 20. Ferromagnetic layers 21 and oxide layers 22 are alternately stacked uniformly in the whole memory layer 20.

In FIG. 4D, a fine oxide 22 is distributed in a memory layer 20 in layers in parallel with a film surface of the memory layer 20, and ferromagnetic layers 21 and oxide layers 22 are alternately stacked. However, the oxide layers 22 are present only in an upper part of the memory layer 20.

These FIGS. 4A to 4D are mere schematic views. A ratio of a thickness of a memory layer to a particle size of an oxide or a thickness of an oxide layer is not limited to that shown in these figures.

As a method for uniformly dispersing an oxide, a method of simultaneously sputtering from a plurality of targets may be the simplest method.

A method of alternately stacking extremely thin films and then annealing may also be used.

A method for distributing an oxide in layers may include a method of causing a wafer to alternately pass through oxide targets and ferromagnetic material targets to perform sputtering, or a method of alternately stacking oxide layers and ferromagnetic layers.

Distribution in layers does not involve formation of continuous oxide layers, but involves a state in which oxide clusters are distributed. The clusters are very small and have a size of about 1 nm to 3 nm each. Layers in which oxide clusters are distributed are preferably distributed in layers with 0.7 nm to 2 nm intervals therebetween.

In a configuration in which an oxide is dispersed in part of a ferromagnetic layer (specifically, a dispersed oxide is present only in part of the ferromagnetic layer), when the oxide is present only near a tunnel insulating layer, the tunnel insulating layer has a large effective thickness, and thus a resistance value may be too high and a magnetoresistance change rate (MR ratio) may be low.

Accordingly, when an oxide is present only in part of the ferromagnetic layer, the oxide is preferably present only in a central part of the ferromagnetic layer or a part opposite to the tunnel insulating layer of the ferromagnetic layer.

In a configuration in which an oxide is distributed in layers in part of a ferromagnetic layer, an oxide layer is preferably present only in a central part of the ferromagnetic layer or a part opposite to a tunnel insulating layer of the ferromagnetic layer.

As a ferromagnetic material contained with an oxide material in a memory layer, a general CoFe alloy, NiFe alloy, or CoNiFe alloy having Co, Fe, or Ni as a main component may be used. Such a ferromagnetic alloy may also contain one or more additional elements including light elements such as B, C, and N; transition metal elements such as Ti, V, Cr, Zr, Nb, Mo, Hf, Ta, and W; rare earth elements such as Gd; or noble metal elements such as Pt and Pd.

An amorphous material or a Heusler material such as CoMnSi, CoMnAl, or CoCrFeAl may also be used.

However, when the CoFe alloy contains Co and Fe at 60 atom % or less in total, an amount of saturated magnetization and a coercive force of a ferromagnetic layer are not satisfactory, for example.

When the CoFe alloy has a Co:Fe ratio of 90:10 to 40:60, the alloy generally exhibits good soft magnetic properties in which magnetic anisotropic dispersion is appropriately suppressed.

Accordingly, contents of Co and Fe may be selected in the same manner in order to provide excellent properties for a ferromagnetic material component in a configuration of a memory element according to an embodiment.

A fine oxide is dispersed in an entire or part of a ferromagnetic layer forming a memory layer, so that the memory layer may have an increased coercive force as compared with a case where the memory layer is formed only by a ferromagnetic material.

This is presumably because the ferromagnetic material is divided by the oxide to increase magnetization stability of the ferromagnetic material.

On the other hand, it is assumed that, since the oxide is dispersed in the ferromagnetic layer, an amount of saturated magnetization Ms is not increased but rather decreased as compared with a case where the memory layer is formed only by a ferromagnetic material.

As is clear from the formula 2, a thermal stability index $\Delta$ is a product of a coercive force Hc and an amount of saturated magnetization Ms. A configuration in which a fine oxide is dispersed in an entire or part of a ferromagnetic layer according to an embodiment is actually measured to find that a thermal stability index $\Delta$ is larger as compared with a case where a memory layer is formed only by a ferromagnetic layer. This is presumably because an increase in a coercive force Hc is sufficiently more significant than a decrease in an amount of saturation magnification Ms.

Since a thermal stability index $\Delta$ is large as described above, a memory layer can have an increased thermal stability.

On the other hand, as is clear from the formula 1, an amount of inversion current is proportional to a squared value of an amount of saturated magnetization Ms. Thus, when an amount of saturated magnetization Ms is small, an amount of inversion current may be reduced.

That is, in a configuration according to an embodiment, an amount of inversion current and thermal stability do not have a trade-off relation and are balanced.

In a configuration according to an embodiment, a ferromagnetic layer forming a memory layer preferably has a coercive force as large as possible. Specifically, the ferromagnetic layer preferably has a coercive force of 200 [Oe] or more.

In a configuration according to an embodiment, a ferromagnetic layer has a coercive force of 200 [Oe] or more, so that thermal stability of a memory layer may be sufficiently improved and an increase in an amount of inversion current may be suppressed.

Further, in an embodiment, a magnetic tunnel junction (MTJ) element is formed using a tunnel insulating layer formed of an insulator as a non-magnetic intermediate layer between a memory layer and a magnetization pinned layer for having an allowance of a saturated current value of a selective transistor.

This allows that a magnetic tunnel junction (MTJ) element is formed using a tunnel insulating layer, so that a magnetoresistance change rate (MR ratio) may be increased and a read signal strength may be increased as compared with a case where a giant magnetoresistance (GMR) element is formed using a non-magnetic conductive layer.

Magnesium oxide (MgO) is particularly used as a material for a tunnel insulating layer, so that a magnetoresistance change rate (MR ratio) may be increased as compared with a case of using aluminum oxide that has been generally used.

Spin injection efficiency generally depends on an MR ratio. As the MR ratio is higher, the spin injection efficiency is further improved, and a density of magnetization inversion current may be further reduced.

Accordingly, magnesium oxide is used as a material for a tunnel insulating layer as an intermediate layer, so that an amount of writing threshold current by spin injection may be reduced, and information may be written (recorded) using a small amount of current. In addition, writing signal strength may be increased.

Thus, an MR ratio (TMR ratio) is secured, so that an amount of writing threshold current by spin injection may be reduced, and information may be written (recorded) using a small amount of current. In addition, a writing signal strength may be increased.

When a tunnel insulating layer is formed by a magnesium oxide (MgO) film, it is more preferable that the MgO film be crystallized and maintain crystalline orientation in a 001 direction.

In an embodiment, an intermediate layer (tunnel insulating layer) between a memory layer and a magnetization pinned layer may not be necessarily formed by magnesium oxide, but may be formed by various insulators, dielectrics, or semiconductors such as aluminum oxide, aluminum nitride, $SiO_2$, $Bi_2O_3$, $MgF_2$, CaF, $SrTiO_2$, $AlLaO_3$, and Al—N—O.

Further, for forming a dispersion state of an oxide in a memory layer appropriate and achieving excellent magnetoresistance properties (MR properties) when using magnesium oxide for an intermediate layer, an annealing temperature is expected to be as high as 300° C. or more, and preferably 340° C. to 360° C. Such an annealing temperature is higher than an annealing temperature (250° C. to 280° C.) for annealing aluminum oxide that has been used for an intermediate layer in related art.

Such an annealing temperature may promote phase separation between an oxide and a magnetic layer to form a matching interface and may be necessary for forming an appropriate internal structure or crystalline structure of a tunnel insulating layer of magnesium oxide or the like.

Consequently, excellent MR properties may not be obtained if not using a heat-resistant ferromagnetic material that is resistant against annealing at such a high temperature for a ferromagnetic layer of a memory element. According to an embodiment, a fine oxide is dispersed in a memory layer, so that thermal stability of the memory layer is improved. Thus, the memory layer may endure annealing at 340° C. to 360° C. without deterioration of magnetic properties of the memory layer.

This is advantageous in that a general semiconductor MOS formation process may be applied to production of a memory having a memory element, and a memory having a memory element according to the present embodiment may be used as a general memory.

An area resistance value of a tunnel insulating layer is preferably controlled to be about several tens $\Omega \, \mu m^2$ or less in order to achieve a current density that may be necessary to invert a magnetization direction of a memory layer by spin injection.

In a tunnel insulating layer formed of an MgO film, in order to achieve an area resistance value within the above-described range, the MgO film is preferably set to have a film thickness of 1.5 nm or less.

In addition, a memory element is preferably reduced in size, so that a magnetization direction of a memory layer may be easily inverted using a small amount of current.

Accordingly, the memory element preferably has an area of 0.04 $\mu m^2$ or less.

It is also possible to directly stack a memory layer having the above-described configuration conditions and another ferromagnetic layer having a different material or composition range. It is further possible to stack a ferromagnetic layer and a soft magnetic layer or to stack a plurality of ferromagnetic layers through a soft magnetic layer or non-magnetic layer. An effect of an embodiment may also be achieved even when layers are stacked in this manner.

In particular, in a configuration in which a plurality of ferromagnetic layers are stacked through a non-magnetic layer, it is possible to control strength of interaction between the ferromagnetic layers. Therefore, if a memory element has a submicron size or smaller, an amount of magnetization inversion current may be suppressed. As a non-magnetic layer material in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

A magnetization pinned layer preferably has unidirectional anisotropy, and a memory layer preferably has uniaxial anisotropy.

The magnetization pinned layer and the memory layer preferably have a film thickness of 1 nm to 30 nm, respectively.

Other configurations of a memory element may be the same as previously known configurations of a memory element in which information is recorded by spin injection.

A magnetization pinned layer is configured to have a pinned magnetization direction using only a ferromagnetic layer or an antiferromagnetic bond between an antiferromagnetic layer and a ferromagnetic layer.

The magnetization pinned layer is configured to be formed of a single ferromagnetic layer, or have a stacked ferrimagnetic structure in which a plurality of ferromagnetic layers are stacked through a non-magnetic layer.

When the magnetization pinned layer has a stacked ferrimagnetic structure, the magnetization pinned layer may have decreased sensitivity to an external magnetic field. Thus, unnecessary magnetization fluctuation in the magnetization pinned layer by the external magnetic field may be suppressed to stably operate a memory element. Further, a film thickness of each ferromagnetic layer may be controlled, and magnetic field leakage from the magnetization pinned layer may be suppressed.

As a material for the ferromagnetic layer forming the magnetization pinned layer having a stacked ferrimagnetic structure, Co, CoFe, CoFeB, or the like may be used. As a material for the non-magnetic layer, Ru, Re, Ir, Os, or the like may be used.

Materials for the antiferromagnetic layer include magnetic materials such as an FeMn alloy, a PtMn alloy, a PtCrMn alloy, an NiMn alloy, an IrMn alloy, NiO, and $Fe_2O_3$.

A non-magnetic element such as Ag, Cu, Au, Al, Si, Bi, Ta, B, C, O, N, Pd, Pt, Zr, Hf, Ir, W, Mo, or Nb may be added to the magnetic material to control magnetic properties or various other properties such as a crystal structure, crystallinity, and material stability.

In a film configuration of a memory element, a memory layer may be placed either on or under a magnetization pinned layer without difficulties.

Information recorded in a memory layer of a memory element may be read by providing a magnetic layer as a reference to information for the memory layer of the memory element through a thin insulating film; and then causing ferroelectric tunnel current to flow through the insulating film or making magnetoresistance.

Next, an embodiment will be described.

Figure 2:
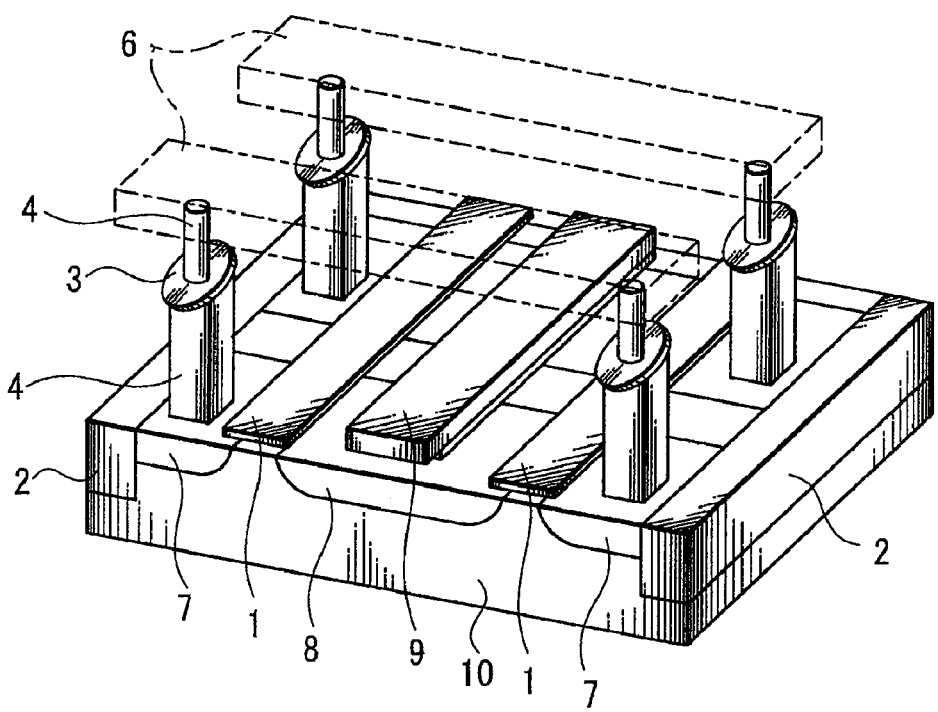
FIG. 2 is a schematic configuration diagram (oblique view) of a memory according to an embodiment.

FIG. 2 shows a schematic configuration diagram (oblique view) of a memory according to an embodiment.

The memory has a memory element placed near an intersection of two types of address wires (word lines and bit lines, for example) perpendicular to each other.

Specifically, in an area isolated by an element isolation layer 2 of a semiconductor substrate 10 such as a silicon substrate, a drain region 8, source regions 7, and gate electrodes 1 are respectively formed which form selective transistors for selecting each memory cell. Of these, the gate electrodes 1 also function as one kind of address wirings (word lines, for example) extending in a longitudinal direction in the figure. The drain region 8 is formed both on the left and right selective transistors in the figure, and a wiring 9 is connected to the drain region 8.

Memory elements 3 are placed between the source regions 7 and the other type of address wirings (bit lines, for example) 6 that are placed above the source regions 7 and extend in a transverse direction in the figure. The memory elements 3 each have a memory layer formed of a ferromagnetic layer in which a magnetization direction is inverted by spin injection.

The memory elements 3 are placed near an intersection of the two types of address wirings 1 and 6.

The memory elements 3 are connected to the bit lines 6 and the source regions 7 respectively through upper or lower contact layers 4.

Thus, a magnetization direction of the memory layer may be inverted by spin injection by causing current to flow into the memory elements 3 in a vertical direction through the two types of address wirings 1 and 6.

Figure 3:
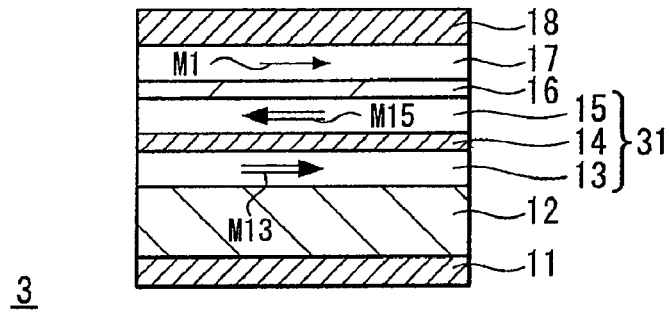
FIG. 3 is a sectional view of a memory element of FIG. 2.

FIG. 3 shows a sectional view of the memory element 3 of the memory according to the present embodiment.

As shown in FIG. 3, the memory element 3 has a magnetization pinned layer 31 provided under a memory layer 17 in which a direction of magnetization M1 is inverted by spin injection. An antiferromagnetic layer 12 is provided under the magnetization pinned layer 31, and a magnetization direction of the magnetization pinned layer 31 is pinned by the antiferromagnetic layer 12.

An insulating layer 16 is provided as a tunnel barrier layer (tunnel insulating layer) between the memory layer 17 and the magnetization pinned layer 31, and an MTJ element is formed by the memory layer 17 and the magnetization pinned layer 31.

A ground layer 11 is formed under the antiferromagnetic layer 12, and a cap layer 18 is formed on the memory layer 17.

The magnetization pinned layer 31 has a stacked ferrimagnetic structure.

Specifically, the magnetization pinned layer 31 has a configuration in which two ferromagnetic layers 13 and 15 are stacked through a non-magnetic layer 14 and antiferromagnetically bonded.

Since the ferromagnetic layers 13 and 15 of the magnetization pinned layer 31 form a stacked ferromagnetic structure, magnetization M13 of the ferromagnetic layer 13 is right-directed and magnetization M15 of the ferromagnetic layer 15 is left-directed, and the magnetizations are oppositely directed. Thus, magnetic fluxes leaked from the ferromagnetic layers 13 and 15 of the magnetization pinned layer 31 cancel each other.

A material for the ferromagnetic layers 13 and 15 of the magnetization pinned layer 31 is not specifically limited. An alloy material formed of one or more of iron, nickel, and cobalt may be used as such a material. The material may further contain a transition metal element such as Nb, Zr, Gd, Ta, Ti, Mo, Mn, or Cu, or a light element such as Si, B, or C. Further, the ferromagnetic layers 13 and 15 may be formed by directly stacking a plurality of films whose materials differ from each other (not through a non-magnetic layer), for example, by forming stacked films of CoFe/NiFe/CoFe.

As a material for the non-magnetic layer 14 forming a stacked ferrimagnetic structure of the magnetization pinned layer 31, ruthenium, copper, chromium, gold, silver, or the like may be used.

A film thickness of the non-magnetic layer 14 varies according to a material used, and is preferably in a range of about 0.5 nm to 2.5 nm.

Film thicknesses of the ferromagnetic layers 13 and 15 and the memory layer 17 may be appropriately adjusted and may preferably be 1 nm to 5 nm each.

In the present embodiment, as described above, the memory layer 17 of the memory element 3 particularly has a configuration in which a fine oxide is dispersed or distributed in layers in an entire or part of the ferromagnetic layer.

The memory layer 17 has a configuration in which a fine oxide is dispersed or distributed in layers in an entire or part of the ferromagnetic layer in this manner, so that the memory layer 17 can have an increased coercive force Hc as compared with a case where the ferromagnetic layer is formed only by a ferromagnetic material. Since the memory layer 17 can have an increased coercive force Hc in this manner, a thermal stability index Δ of the memory layer 17 may be increased to improve thermal stability of the memory layer 17.

Further, a fine oxide is dispersed or distributed in layers in an entire or part of the ferromagnetic layer forming the memory layer 17, so that the memory layer 17 can have an increased coercive force Hc without increasing an amount of saturated magnetization Ms of the memory layer 17.

Thermal stability of the memory layer 17 may thus be sufficiently secured without increasing an amount of writing current which may be necessary to invert a direction of magnetization M1 of the memory layer 17.

Various above-described ferromagnetic materials or oxide materials may be used as ferromagnetic materials for the ferromagnetic layer forming the memory layer 17 or oxide materials to be dispersed in the ferromagnetic layer.

Further, in an embodiment of the present embodiment, when an insulating layer 16 as an intermediate layer is a magnesium oxide layer, a magnetoresistance change rate (MR ratio) may be increased.

An MR ratio is increased in this manner, so that spin injection efficiency may be increased and reduced a current density that may be necessary to invert a direction of magnetization M1 of the memory layer 17.

The memory element 3 according to an embodiment of the present may be produced by continuously forming from the ground layer 11 to the cap layer 18 in a vacuum apparatus and then forming a pattern of the memory element 3 by processing such as etching.

In the above-described present embodiment, the memory layer 17 of the memory element 3 has a configuration in which a fine oxide is dispersed or distributed in layers in an entire or part of the ferromagnetic layer. Thermal stability of the memory layer 17 may thus be sufficiently secured without increasing an amount of writing current which may be necessary to invert a direction of magnetization M1 of the memory layer 17.

Thermal stability of the memory layer 17 is improved, so that it is possible to increase an operation region in which information is recorded by causing current to flow into the memory element 3, and to secure a wide operational area to stably operate the memory element 3.

Since an amount of writing current is not increased if thermal stability is secured for the memory layer 17 of the memory element 3, a large amount of current does not have to be applied. Thus, dielectric breakdown of the insulating layer 16 as an intermediate layer does not occur.

Accordingly, a highly reliable memory that is stably operated may be achieved.

Further, thermal stability may be sufficiently secured although an amount of writing current is reduced, and thus an amount of writing current may be decreased and reduce power consumption when performing writing in the memory element 3.

Therefore, it is possible to reduce total power consumption in a memory having a memory cell formed by the memory element 3 according to the present embodiment.

Accordingly, it is possible to achieve a highly reliable memory that has excellent information retaining properties and is stably operated, and to reduce power consumption in a memory having the memory element 3.

A memory having the memory element 3 shown in FIG. 3 and having a configuration shown in FIG. 2 is advantageous in that a typical semiconductor MOS formation process may be applied to production of the memory.

Accordingly, the memory according to the present embodiment may be applied to a general memory.

In particular, in the memory element 3 shown in FIG. 3, a fine oxide is dispersed or distributed in layers, so that thermal stability of the memory layer 17 is improved. Thus, magnetic properties of the memory layer 17 do not deteriorate by annealing at 340° C. to 360° C., and a typical semiconductor MOS formation process may be easily applied to production of the memory.

Here, properties of a memory element configured according to an embodiment were examined, in which a material, film thickness, and the like of each layer were specifically selected.

An actual memory has a switching semiconductor circuit or the like other than a memory element, as shown in FIG. 2. However, a study was conducted here for a wafer having only a memory element formed, in order to examine magnetization inversion properties of a memory layer.

EXPERIMENT 1

Examples

A thermal oxidation film having a thickness of 300 nm was formed on a silicon substrate having a thickness of 0.725 mm, and a memory element 3 having a configuration shown in FIG. 3 was formed on the thermal oxidation film.

Specifically, each layer in the memory element 3 having a configuration as shown in FIG. 3 was formed by selecting a material and film thickness of each layer in the following manner. A ground film 11 was a Ta film having a film thickness of 3 nm. An antiferromagnetic layer 12 was a PtMn film having a film thickness of 20 nm. A ferromagnetic layer 13 forming a magnetization pinned layer 31 was a CoFe film having a film thickness of 2 nm. A ferromagnetic layer 15 was a CoFeB film having a film thickness of 2.5 nm. A nonmagnetic layer 14 forming the magnetization pinned layer 31 having a stacked ferrimagnetic structure was a Ru film having a film thickness of 0.8 nm. An insulating layer (barrier layer) 16 as a tunnel insulating layer was a magnesium oxide film having a film thickness of 0.9 nm. A memory layer 17 was formed of a combination of a ferromagnetic material with an oxide. A cap layer 18 was a Ta film having a film thickness of 5 nm. Further, a Cu film (not shown) having a film thickness of 100 nm (word line described later) was provided between the ground film 11 and the antiferromagnetic layer 12.

In the above film configuration, the ferromagnetic layer in the memory layer had a fixed material composition of Co 45:Fe 30:B 25 and a fixed ferromagnetic layer equivalent film thickness of 2.5 nm, and each oxide was added to the ferromagnetic layer. The PtMn film had a composition of Pt 50:Mn 50 (atom %), and the CoFe film had a composition of Co 90:Fe 10 (atom %).

Each layer other than the insulating layer 16 formed of a magnesium oxide film was deposited by DC magnetron sputtering.

The insulating layer 16 formed of a magnesium oxide (MgO) film was deposited by RF magnetron sputtering.

After deposition of each layer of the memory element 3, the PtMn film of the antiferromagnetic layer 12 was thermally treated for regularization at 10K Oe at 360° C. for two hours in a magnetic thermal treatment furnace.

Next, a word line part was masked by photolithography, and then the stacked films other than the word line part were selectively etched by Ar plasma to form a word line (lower electrode). At this time, the stacked films other than the word line part was etched to a substrate depth of 5 nm.

Thereafter, a mask of a pattern of the memory element 3 was formed by an electron beam lithography apparatus, and the stacked films were selectively etched to form the memory element 3. The stacked films other than the part of the memory element 3 were etched to immediately above the Cu layer of the word line.

Since a sufficient amount of current is preferably caused to flow into a memory element for property evaluation in order to generate spin torque that may be necessary for magnetization inversion, it is preferable to suppress a resistance value of a tunnel insulating layer. Thus, the memory element 3 was configured to have an elliptical pattern (minor axis: 0.09 μm×major axis: 0.18 μm) and have an area resistance value of 20 Ωμm².

The stacked films other than the part of the memory element 3 was insulated by $Al_2O_3$ sputtering with a thickness of about 100 nm.

Thereafter, a bit line as an upper electrode and a pad for measurement were formed by photolithography.

A sample of the memory element 3 was prepared in this manner.

Each sample of the memory element 3 was prepared by the above production method by changing a material, a volume rate, and a distribution state of an oxide to be mixed with a ferromagnetic material of the memory layer 17.

As an oxide distribution state, either of "uniform distribution" and "layered distribution" was selected in accordance with an oxide material.

"Uniform distribution" is a state in which a fine oxide is uniformly dispersed in the ferroelectric layer of the memory layer 17. Specifically, sputtering was performed using targets for a ferromagnetic material and targets for an oxide at the same time to form the memory layer 17. A sputtering speed for each of the oxide and the ferromagnetic material was controlled to control a volume rate of the oxide.

"Layered distribution" is a distribution state in which an oxide is distributed in layers in the memory layer 17. Specifically, the memory layer 17 was formed by performing sputtering by switching between targets for a ferromagnetic material and targets for an oxide, so that the ferromagnetic material, the oxide, the ferromagnetic material, the oxide, and the ferromagnetic material were stacked in this order from the bottom and the divided three layers of the ferromagnetic material were each 1 nm-thick, 1 nm-thick, and 0.5 nm-thick from the bottom. A volume rate of the oxide was controlled by controlling a thickness of a layer of the oxide, specifically, a sputtering time for the oxide.

Conditions for forming each sample are collectively shown in Table 1.

TABLE 1

| Sample No | Oxide material added | Oxide volume rate | Distribution state | Note |
|---|---|---|---|---|
| 1 | $SiO_2$ | 3% | Uniform distribution | Comparative Example |
| 2 | | 8% | | Example |
| 3 | | 20% | | |
| 4 | | 35% | | |
| 5 | | 45% | | Comparative Example |
| 6 | MgO | 3% | Uniform distribution | Comparative Example |
| 7 | | 8% | | Example |
| 8 | | 20% | | |
| 9 | | 35% | | |
| 10 | | 45% | | Comparative Example |
| 11 | $Y_2O_3$ | 3% | Layered distribution | Comparative Example |
| 12 | | 8% | | Example |
| 13 | | 20% | | |
| 14 | | 35% | | |
| 15 | | 45% | | Comparative Example |
| 16 | $SiTiO_x$ | 10% | Uniform distribution | Example |
| 17 | | 25% | | |
| 18 | | 35% | | |
| 19 | $MgTaO_x$ | 10% | Layered distribution | Example |
| 20 | | 25% | | |
| 21 | | 35% | | |
| 22 | $YZrO_x$ | 10% | Layered distribution | Example |
| 23 | | 25% | | |
| 24 | | 35% | | |

Properties of each sample of the memory element 3 prepared were evaluated in the following manner.

Prior to the measurement, each sample was configured such that a magnetic field may be provided for the memory element 3 from the outside in order to control a value in a positive direction of inversion current to be symmetrical with a value in a negative direction of inversion current. Voltage applied to the memory element 3 was set to be 1 V or less which does not cause breakdown of the insulating layer 16.

Measurement of Coercive Force

A coercive force of the memory element was measured.

First, a resistance value of the memory element was measured while applying a continuously changing external magnetic field to the memory element. A temperature was controlled to room temperature (25° C.), and bias voltage applied to a terminal of the word line and a terminal of the bit line was controlled to 10 mV.

When an external magnetic field is applied in a direction opposite to a magnetization direction of the memory layer and the external magnetic field exceeds a coercive force of the memory layer, the magnetization direction of the memory layer is inverted. Since a resistance value of the memory element is changed by inversion of the magnetization direction, a magnitude of the external magnetic field when the resistance value is changed is expected to be equal to a coercive force of the memory element. Based on this outcome, a coercive force of the memory element was determined.

Measurement of Inversion Current Value and Thermal Stability

An inversion current value was measured in order to evaluate writing properties of a memory element according to an embodiment.

Current having a pulse width of 10 μs to 100 ms was caused to flow into a memory element to measure a resistance value of the memory element thereafter. Further, an amount of current caused to flow into the memory element was changed to determine a current value in which magnetization of a memory layer was inverted. A value obtained by extrapolating pulse width dependence into a pulse width of 1 ns was defined as an inversion current value.

A pulse width dependence inclination of an inversion current value corresponds to a thermal stability index (Δ) described above of a memory element. As a change in (or inclination of) an inversion current value based on a pulse width is smaller, a memory element is more resistant to thermal disturbance. As described above, in order to use a memory element for a memory, an index Δ of 60 or more is preferable.

In order to determine a variability between memory elements, about 20 memory elements having the same configuration were prepared and the above measurement was conducted to determine an average inversion current value and an average thermal stability index (Δ).

Figure 5:
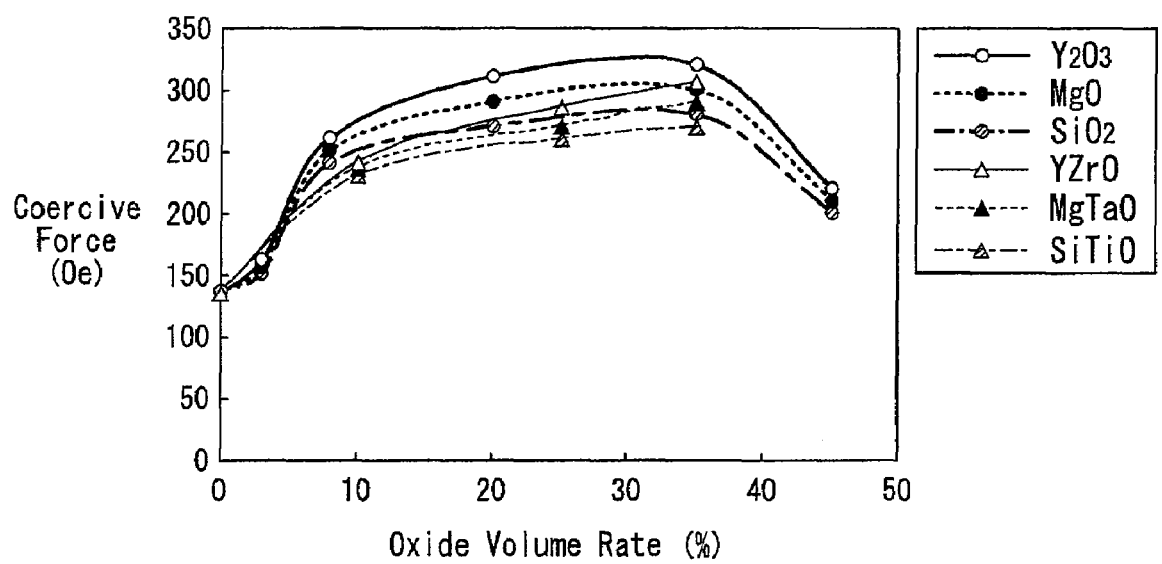
FIG. 5 is a view showing a relation between a volume rate of various oxides and a coercive force.
Figure 6:
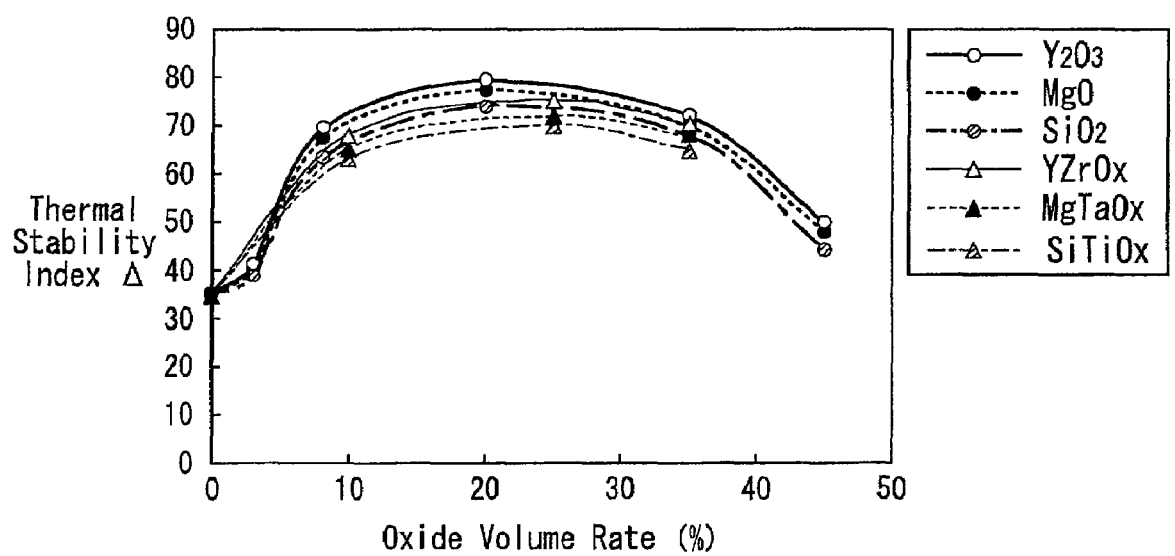
FIG. 6 is a view showing a relation between a volume rate of various oxides and a thermal stability index Δ.
Figure 7:
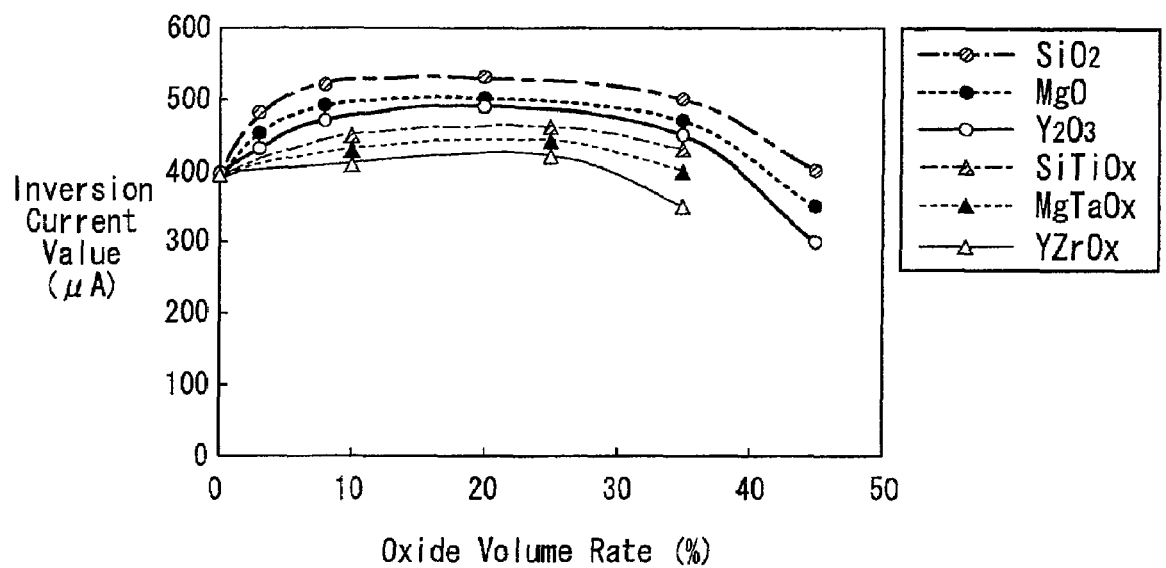
FIG. 7 is a view showing a relation between a volume rate of various oxides and an inversion current value.
Figure 8:
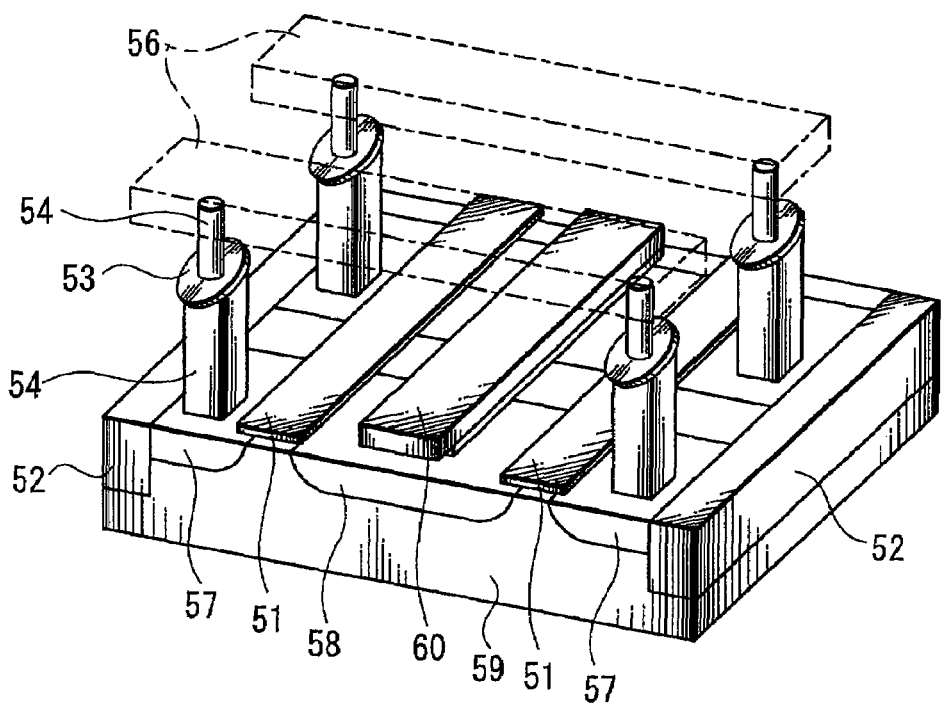
FIG. 8 is a schematic configuration diagram (oblique view) of a memory utilizing magnetization inversion by spin injection.
Figure 9:
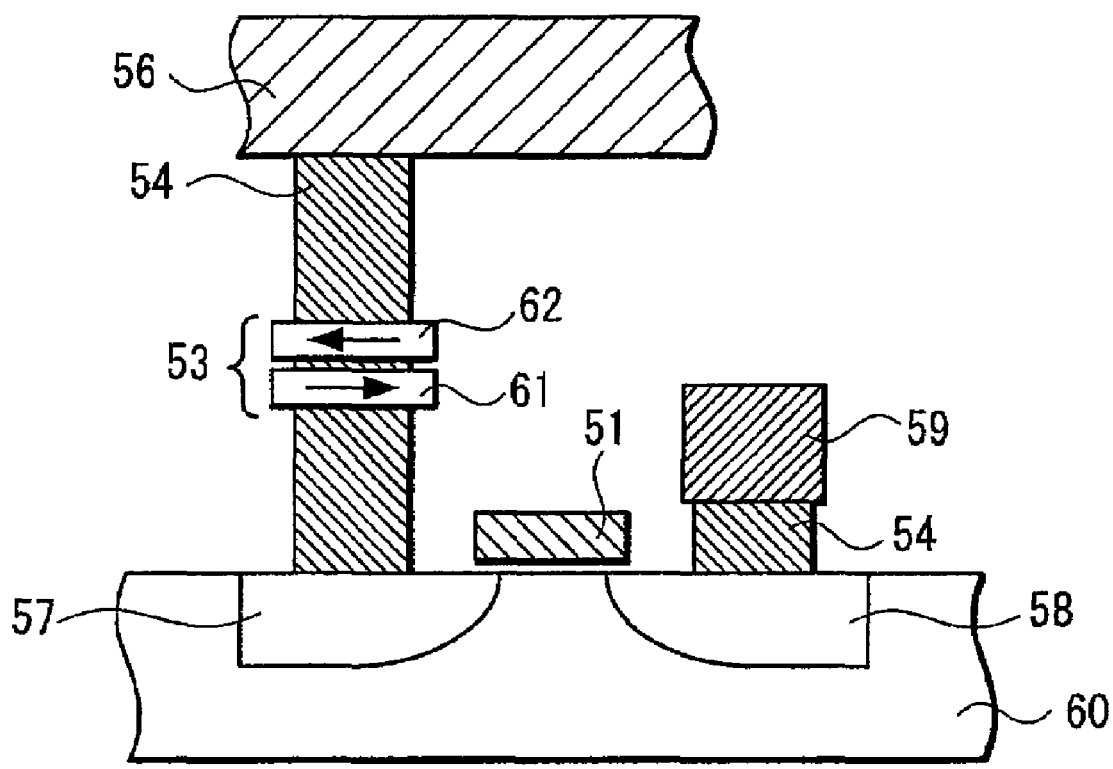
FIG. 9 is a sectional view of the memory of FIG. 8.

Measurement results for each sample are shown in FIGS. 5 to 7.

FIG. 5 shows results of measuring a coercive force, FIG. 6 shows results of measuring a thermal stability index (Δ), and FIG. 7 shows results of measuring an inversion current value.

The respective measurement results are plotted in each figure with a horizontal axis representing an oxide volume rate (%).

As is clear from FIG. 5, when an oxide volume rate of is 5% or more, a coercive force of 200 [Oe] or more may be achieved.

When an oxide volume rate is 40% or more, an effect of reducing a volume rate of a ferromagnetic material is more significant than an effect of an oxide to increase a coercive force, and hence, a decrease in the coercive force is observed.

As is clear from FIG. 6, a thermal stability index Δ is highly correlated with a coercive force shown in FIG. 5, and a thermal stability index Δ is affected by a relation between a decrease in a volume rate of a ferromagnetic material and an effect of an oxide to increase a coercive force.

The outcome shows that an index Δ is significantly increased and memory retaining properties are improved by dispersing oxides in a memory layer.

Each sample having an oxide volume rate of 8%, 20%, 25%, or 35% is found to have a thermal stability index Δ of 60 or more for an actual memory.

The memory element used in this experiment has a film configuration in which a small amount of inversion current may be obtained to use as an actual memory.

When the film configuration includes a memory layer formed by only a ferromagnetic material as in related art instead of a configuration including oxides dispersed in a memory layer, an amount of inversion current may be small, but a thermal stability index Δ is also small.

As is clear from FIG. 7, although an oxide is dispersed in a memory layer, an inversion current value is not considerably increased, and the value is increased by 5% to 30% at most as compared with a memory layer composed only of a ferromagnetic material (about 400 μA).

As is clear from FIGS. 5 to 7, when an oxide is dispersed in a memory layer, a coercive force and a thermal stability index Δ are sufficiently secured, an amount of inversion current is not considerably increased, and a small amount of inversion current is maintained.

Accordingly, an embodiment can balance thermal stability and a decrease in an amount of inversion current which have been assumed to have a trade-off relation originally.

An embodiment may employ not only a film configuration of the memory element 3 shown in each of the above-described embodiments but also various other film configurations.

In each of the above-described embodiments, the magnetization pinned layer 31 has a stacked ferrimagnetic structure formed of the two ferromagnetic layers 13 and 15 and the non-magnetic layer 14. However, the magnetization pinned layer may be formed by a single ferromagnetic layer, for example.

A memory element may be formed by providing magnetization pinned layers on and under a memory layer, respectively.

In this case, one of an intermediate layer between the upper magnetization pinned layer and the memory layer and an intermediate layer between the lower magnetization pinned layer and the memory layer is a tunnel insulating layer, but the other intermediate layer may be either a tunnel insulating layer or a non-magnetic conductive layer (such as a non-magnetic metal layer).

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory element comprising:
a memory layer that retains information based on a magnetization state of a magnetic material, wherein
a magnetization pinned layer is provided for the memory layer through an intermediate layer,
the intermediate layer is formed of an insulator,
spin-polarized electrons are injected in a stacking direction to change a magnetization direction of the memory layer, so that information is recorded in the memory layer, and
a fine oxide is dispersed in an entire or part of a ferromagnetic layer forming the memory layer, wherein
the ferromagnetic layer forming the memory layer has a coercive force of 200 Oe or more.

2. A memory element according to claim 1, wherein
the fine oxide is an oxide selected from the group consisting of silicon oxide, aluminum oxide, magnesium oxide, tantalum oxide, gadolinium oxide, titanium oxide, boron oxide, zinc oxide, gallium oxide, yttrium oxide, zirconium oxide, hafnium oxide, and composite mixtures thereof.

3. A memory element comprising:
a memory layer that retains information based on a magnetization state of a magnetic material, wherein
a magnetization pinned layer is provided for the memory layer through an intermediate layer;
the intermediate layer is formed of an insulator,
spin-polarized electrons are injected in a stacking direction to change a magnetization direction of the memory layer, so that information is recorded in the memory layer, and
a fine oxide is distributed in layers in an entire or part of a ferromagnetic layer forming the memory layer.

4. A memory element according to claim 3, wherein
the ferromagnetic layer forming the memory layer has a coercive force of 200 Oe or more.

5. A memory element according to claim 3, wherein
the fine oxide is an oxide selected from the group consisting of silicon oxide, aluminum oxide, magnesium oxide, tantalum oxide, gadolinium oxide, titanium oxide, boron oxide, zinc oxide, gallium oxide, yttrium oxide, zirconium oxide, hafnium oxide, and composite mixtures thereof.

6. A memory comprising:
a memory element having a memory layer that retains information based on a magnetization state of a magnetic material; and
two wirings intersecting with each other, wherein
the memory element has a configuration in which a magnetization pinned layer is provided for the memory layer through an intermediate layer;
the intermediate layer is formed of an insulator;
spin-polarized electrons are injected in a stacking direction to change a magnetization direction of the memory layer, so that information is recorded in the memory layer; and
a fine oxide is dispersed in an entire or part of a ferromagnetic layer forming the memory layer, wherein
the ferromagnetic layer forming the memory layer has a coercive force of 200 Oe or more;
the memory element is placed near an intersection of the two wirings and between the two wirings, and
current in the stacking direction flows into the memory element through the two wirings.

7. A memory comprising:
a memory element having a memory layer that retains information based on a magnetization state of a magnetic material; and two wirings intersecting with each other, wherein the memory element has a configuration in which a magnetization pinned layer is provided for the memory layer through an intermediate layer;

the intermediate layer is formed of an insulator;

spin-polarized electrons are injected in a stacking direction to change a magnetization direction of the memory layer, so that information is recorded in the memory layer; and a fine oxide is distributed in layers in an entire or part of a ferromagnetic layer forming the memory layer, the memory element is placed near an intersection of the two wirings and between the two wirings, and current in the stacking direction flows into the memory element through the two wirings.

* * * * *